United States Patent [19]

Hugg

[11] Patent Number: 5,782,356
[45] Date of Patent: Jul. 21, 1998

[54] CONTAINER FOR STORING AND TRANSPORTING FRAGILE OBJECTS

[75] Inventor: Joshua S. Hugg. Wappingers Falls, N.Y.

[73] Assignee: International Business Machines Corporation, Armonk, N.Y.

[21] Appl. No.: 641,378

[22] Filed: Apr. 30, 1996

[51] Int. Cl.$^6$ ........................................... B65D 85/30
[52] U.S. Cl. ........................................ 206/454; 206/725
[58] Field of Search .................... 206/425, 449, 206/454, 701, 710, 711, 722, 723, 725

[56] References Cited

U.S. PATENT DOCUMENTS

| D. 239,806 | 5/1976 | Bresnickello | D6/183 |
|---|---|---|---|
| 254,836 | 3/1882 | Nauerth . | |
| D. 264,025 | 4/1982 | Franklin et al. | D6/24 |
| 789,494 | 5/1905 | Garbo . | |
| 1,030,317 | 6/1912 | Middaugh . | |
| 3,486,631 | 12/1969 | Rodman | 211/41 |
| 4,448,307 | 5/1984 | Roggenkamp . | |
| 4,620,740 | 11/1986 | Kinzig | 294/159 |
| 4,640,416 | 2/1987 | Northrup et al. | 206/425 |
| 4,709,815 | 12/1987 | Price et al. | 206/387 |
| 4,776,623 | 10/1988 | Manning | 294/143 |
| 4,981,222 | 1/1991 | Lee | 211/41 |

FOREIGN PATENT DOCUMENTS

| 2 502 921 | 3/1981 | France . |
|---|---|---|
| 58 202542 | 11/1983 | Japan . |
| 60-037723 | 2/1985 | Japan . |
| 2 041 726 | 9/1980 | United Kingdom . |
| WO 92/21146 | 11/1992 | WIPO . |

OTHER PUBLICATIONS

Research Disclosure, No. 336, 1 Apr. 1992, p. 254 XP000304795 "Product Carrier".

Fosnight, et al., "300mm: A New Frontier", Solid State Technology, Feb. 1996, pp. 77–81.

Joshua S. Hugg, US Patent Application filed Apr. 30, 1996, based on IBM Docket FI9–96–049, "Container for Storing and Transporting Lithography Reticles".

*Primary Examiner*—Jacob K. Ackun
*Attorney, Agent, or Firm*—Tiffany L. Townsend; Alison D. Mortinger

[57] ABSTRACT

A container for storing and transporting fragile objects, comprising a pair of side walls, a top wall, a bottom wall, and a back wall, forming a box with one open side; a plurality of spaced apart partitions between the side walls for separating the objects; and means to maintain the objects in an angled orientation during storage and transport so that the objects rest against the partitions and do not easily move.

16 Claims, 2 Drawing Sheets

5,782,356

CONTAINER FOR STORING AND TRANSPORTING FRAGILE OBJECTS

RELATED APPLICATIONS

This invention is related to copending U.S. Pat. application Ser. No. 08/641,381, filed on the same day as the present application, entitled "Container for Storing and Transporting Lithography Reticles," assigned to the present assignee.

FIELD OF THE INVENTION

This invention is directed to a container for storing and transporting fragile objects, and more particularly for storage and transportation of semiconductor wafers and/or lithography reticles.

BACKGROUND OF THE INVENTION

A reticle is used as a mask between a light source used for exposure and a photosensitive polymer on a wafer in semiconductor lithography. By masking off areas from exposure a pattern can be generated on the wafer by causing the photosensitive polymer to react. Depending on the type of resist used, the exposed portion will either dissolve or be resistant to subsequent developing, where the image is finally resolved.

If there happens to be contamination on the reticle, the pattern resulting from the contaminants will deviate from what is desired. To prevent this, a transparent membrane or pellicle is attached to and positioned over the reticle. Contaminants will gather on the pellicle instead of the reticle, and will be out of focus during exposure and not resolved, thus not affecting the desired pattern. The pellicle membrane is very thin and very fragile, so that great care is needed in protecting it from tears.

Currently, reticles are stored and transported in cassettes. For a Micrascan tool, for example, a single reticle is stored in a vertical position inside a box-like cassette and the reticle tends to rattle around inside, often causing damage to the pellicle.

Thus, there remains a need for a reticle storage and transport container which reduces or prevents damage to reticles resulting from them moving around in the container.

SUMMARY OF THE INVENTION

It is therefore an object of the present invention to provide a container for storing and transporting reticles which prevents damage from them moving around in the container.

It is a further object to provide such a container that is suitable for carrying other types of fragile objects.

In accordance with the above listed and other objects, a container is provided for storing and transporting fragile objects, comprising a pair of side walls, a top wall, a bottom wall, and a back wall, forming a box with one open side; a plurality of spaced apart partitions between the side walls for separating the objects; and means to maintain the objects in an angled orientation during storage and transport so that the objects rest against the partitions and do not easily move.

BRIEF DESCRIPTION OF THE DRAWINGS

These and other features, aspects, and advantages will be more readily apparent and better understood from the following detailed description of the invention, in which.

DESCRIPTION OF THE PREFERRED EMBODIMENTS

Figure 1:
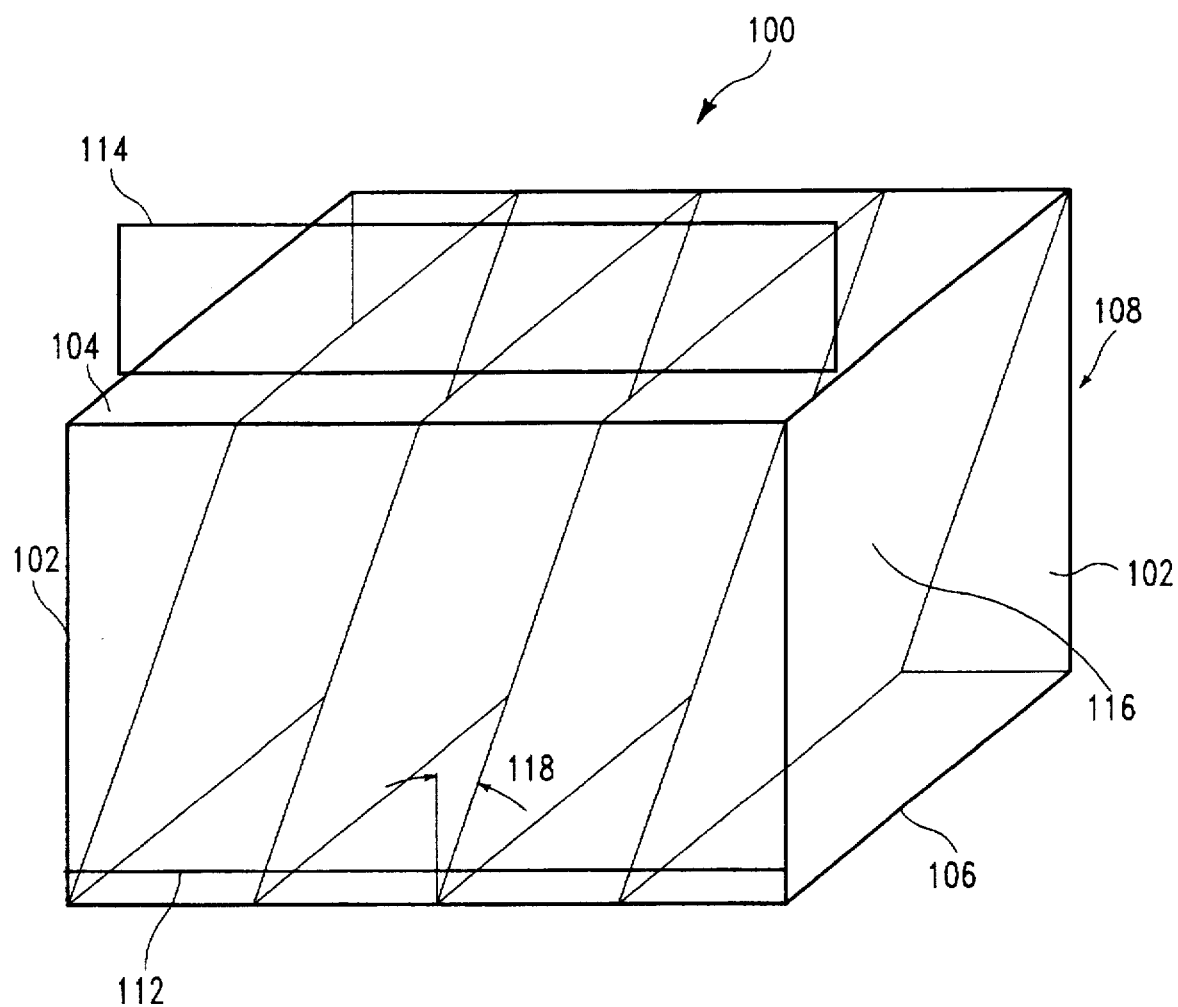
FIG. 1 shows a container with angled partitions.

Referring now to the drawings and more particularly to FIG. 1, a container with angled partitions is shown. This type of container is well-suited to the storage and transport of reticles, although other types of fragile objects may be stored and transported as well. Container 100 has side walls 102, top side 104, bottom side 106, and back side 108 generally forming a box with an open side 110 opposing back side 108. A retaining bar 112 or other suitable retaining means is attached to side walls 102 and spans open side 110 so that the reticles do not slide out of open side 110 during transport. Retaining bar 112 may be positioned at any suitable distance from bottom wall 106 so that the reticles are easily inserted into container 100 yet prevented from sliding out.

Container 100 has a handle 114 for carrying, which may be positioned off-center on top side 104 so that during transport container 100 tilts, with back wall 108 lower than open side 110. This further prevents the reticles from sliding out.

Inside container 100 are partitions or dividers 116 between side walls 102 which separate the reticles. Partitions 116 are fixed at an off-vertical angle 118. The degree of angle 118 depends on the center of gravity of the reticles, as well as the coefficient of friction of the reticle with respect to the partition material, but must be large enough (e.g. when approaching vertical) or small enough (e.g. when approaching horizontal) so that the reticles rest against partitions 116 and minimize or prevent moving or rattling during loading or transport.

Generally, the angle 118 should be such that the following conditions are satisfied:

$x_g < x_0$ $x'_g > x_0$ where $x_g$=calculated or measured x component of the center of gravity for the object, assuming the direction of tilt is perpendicular to the x-y plane;

$x'_g$=relative x position of $x_g$ upon tilting the object;

$x_0$=measured width of object, assuming the direction of tilt is perpendicular to the y-z plane, also the pivot point around which the object is tilted.

A working model was built with an angle 118 of 18 degrees (72 degrees from horizontal), which satisfies the above conditions. The number and size of partitions 116 are dependent upon the reticle size and weight, as well as the desired weight and dimension of container 100 when loaded.

Figure 2:
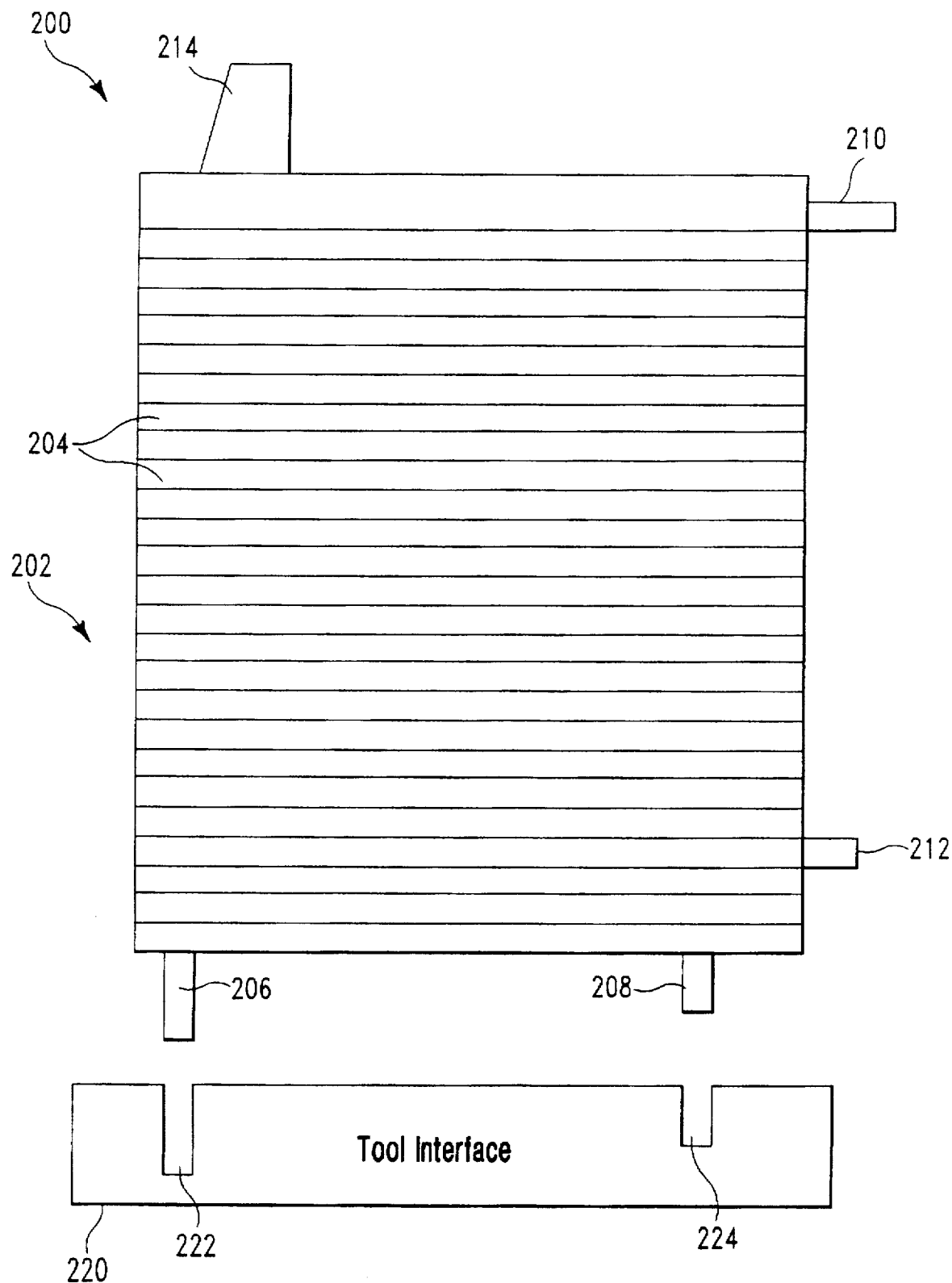
FIG. 2 shows a container with non-angled partitions and support pegs to maintain the container in an angled position; all in accordance with the present invention.

An alternate method for maintaining objects in an angled orientation during storage and transport is illustrated in FIG. 2. Container 200 is similar to container 100 shown in FIG. 1, but is better suited to the storage and transport of fragile semiconductor wafers, and has the added advantage of being able to be used with automated wafer handling apparatus for loading into processing tools.

Container 200 has an open side 202, and non-angled partitions 204 for separating the wafers. Support peg pairs 206, 208 (back ones not visible) of differing lengths are attached externally near the corners on one side of container 200 so that container 200 tilts away from open side 202 during storage, and partitions 204 are effectively angled slightly off-horizontal. The lengths of peg pairs 206, 208 (and thus the effective angle of partitions 204) is dependent upon the same factors as with partitions 116 in container 100, and are generally set so that the desired angle is achieved when container 200 is supported by peg pairs 206, 208. Alternately, support peg pairs 210, 212 of differing lengths can be used when placing container 200 on a surface with open side 202 facing upwards to effectively angle partitions 204 slightly off-vertical.

The angling of the wafers or other objects in container 200 has an additional advantage. It is common to imprint bar codes for production tracking at the edge of the wafers. In a typical wafer cassette in which the wafers are stored in a vertical stack, it is difficult if not impossible to read the bar codes while the wafers are in the cassette. With an angled orientation of the proper degree as described, it is possible to scan the bar codes while in the container and thus improve tracking and selectivity of wafers within the cassette through the production process.

To maintain the wafers in an angled position during transport, an off-center handle 214 is attached similar to handle 112. The wafers are thus prevented from sliding out while being carried.

In order for container 200 to be used with an automated wafer handling apparatus, a tool interface 220 is positioned next to the tool (not shown). Tool interface 220 has slot pairs 222, 224 with depths corresponding to the lengths of support peg pairs 206 and 208, respectively. When support peg pairs 206, 208 are inserted in slots 222, 224, partitions 204 are horizontal and the wafers in container 200 can be automatically loaded and unloaded from the tool.

In summary, a container has been provided for storing and transporting reticles which prevents damage from them moving around in the container, and which is suitable for carrying other types of fragile objects such as semiconductor wafers. The present invention is described herein in the context of a reticle or wafer carrier merely as a specific example, and is not meant to limit applicability of the invention to semiconductor technology. Those skilled in the art will understand that the invention is broadly applicable to any container in which it is desirable to store and transporting fragile objects, comprising a pair of side walls, a top wall, a bottom wall, and a back wall, forming a box with one open side; a plurality of spaced apart partitions between the side walls for separating the objects; and means to maintain the objects in an angled orientation during storage and transport so that the objects rest against the partitions and do not easily move.

While the invention has been described in terms of specific embodiments, it is evident in view of the foregoing description that numerous alternatives, modifications and variations will be apparent to those skilled in the art. Thus, the invention is intended to encompass all such alternatives, modifications and variations which fall within the scope and spirit of the invention and the appended claims.

What is claimed is:

1. A container for storing and transporting fragile objects, comprising:

at least one fragile object;

a pair of side walls, a top wall, a bottom wall, and a back wall, forming a box with one open side;

a plurality of spaced apart partitions between the side walls for separating the objects, wherein the angle of the partitions is such that the following conditions are satisfied:

$$x_g < x_0$$
   $$x'_g > x_0$$

where $x_g$=calculated or measured x component of the center of gravity for the object, assuming the direction of tilt is perpendicular to the x-y plane;

$X'_g$=relative x position of $x_g$ upon tilting the object;

$x_0$=measured width of object, assuming the direction of tilt is perpendicular to the y-z plane, also the pivot point around which the object is tilted;

and means to maintain the objects in an angled orientation during storage and transport so that the objects rest against the partitions and do not easily move.

2. The container of claim 1 wherein the partitions are angled in order to maintain the objects in an angled orientation during storage and transport.

3. The container of claim 2 further comprising a retaining means attached to the side walls and spanning the open side for retaining the objects inside the container during transport.

4. The container of claim 1 wherein the objects are semiconductor wafers, further comprising means to maintain the wafers in a horizontal orientation for automated loading into a processing tool.

5. The container of claim 4 wherein the means to maintain the wafers in a horizontal orientation for automated loading comprises a tool interface having slots of differing depth corresponding to the lengths of the support pegs.

6. The container of claim 1 further comprising a handle attached off-center to the container such that in transport the back wall is lower than the open side.

7. The container of claim 1 wherein the objects are reticles.

8. A container for storing and transporting fragile objects, comprising:

at least one fragile object;

a pair of side walls, a top wall, a bottom wall, and a back wall, forming a box with one open side;

a plurality of spaced apart partitions between the side walls for separating objects;

a handle attached off-center to the container in order to maintain the objects in an angled orientation during transport so that the objects rest against the partitions and do not easily move; and a plurality of support pegs attached externally to a wall of the container, the support pegs differing in length in order to maintain the objects in an angled orientation during storage.

9. The container of claim 8 wherein the partitions are angled in order to maintain the objects in an angled orientation during storage and transport.

10. The container of claim 9 wherein the angle of the partitions is such that the following conditions are satisfied:

$$x_g < x_0$$
$$x'_g > x_0$$

where $x_g$=calculated or measured x component of the center of gravity for the object, assuming the direction of tilt is perpendicular to the x-y plane;

$x'_g$=relative x position of $_g x$ upon tilting the object;

$X_0$=measured width of object, assuming the direction of tilt is perpendicular to the y-z plane, also the pivot point around which the object is tilted.

11. The container of claim 9 further comprising a retaining means attached to the side walls and spanning the open side for retaining the objects inside the container during transport.

12. The container of claim 8 wherein the partitions are non-angled.

13. The container of claim 8 wherein the objects are semiconductor wafers, further comprising means to maintain the wafers in a horizontal orientation for automated loading into a processing tool.

14. The container of claim 13 wherein the means to maintain the wafers in a horizontal orientation for automated loading comprises a tool interface having slots of differing depth corresponding to the lengths of the support pegs.

15. The container of claim 8 wherein the fragile objects are reticles.

16. A container for storing and transporting fragile objects, comprising:

at least one fragile object;

a pair of side walls, a top wall, a bottom wall, and a back wall, forming a box with one open side;

a plurality of spaced apart partitions between the side walls for separating the objects;

a handle attached off-center to the container in order to maintain the objects in an angled orientation during transport; and a plurality of support pegs attached externally to a wall of the container, the support pegs differing in length in order to maintain the objects in an angled orientation during storage.

* * * * *

UNITED STATES PATENT AND TRADEMARK OFFICE
CERTIFICATE OF CORRECTION

PATENT : 5,782,356
DATED : July 21, 1998
INVENTOR(S) : William H. Advocate, et al.

It is certified that error appears in the above-identified patent and that said Letters Patent is hereby corrected as shown below:

On the title page:

Under item [19], "Hugg" should be –Advocate, et al.--; and

In item [75], before "Joshua S. Hugg", insert the following inventors:
--William H. Advocate, Staatsburg, New York; Christopher P. Ausschnitt; Brookfield, Connecticut;--

Signed and Sealed this

First Day of December, 1998

*Attest:*

BRUCE LEHMAN

*Attesting Officer*    *Commissioner of Patents and Trademarks*